(12) United States Patent
Kadota et al.

(10) Patent No.: US 7,581,306 B2
(45) Date of Patent: Sep. 1, 2009

(54) METHOD FOR PRODUCING A BOUNDARY ACOUSTIC WAVE DEVICE

(75) Inventors: Michio Kadota, Kyoto (JP); Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 111 days.

(21) Appl. No.: 11/835,184

(22) Filed: Aug. 7, 2007

(65) Prior Publication Data

US 2007/0284965 A1 Dec. 13, 2007

Related U.S. Application Data

(60) Division of application No. 11/535,560, filed on Sep. 27, 2006, now Pat. No. 7,322,093, which is a continuation of application No. PCT/JP2005/005414, filed on Mar. 24, 2005.

(30) Foreign Application Priority Data

Mar. 29, 2004 (JP) ............................. 2004-095962

(51) Int. Cl.
*H04R 31/00* (2006.01)
(52) U.S. Cl. ...................... 29/594; 29/609.1; 29/25.35; 310/311; 310/313 A; 310/313 B; 310/313 R; 310/364; 333/141; 333/193
(58) Field of Classification Search ................ 29/25.35, 29/594, 609.1; 310/311; 333/141, 193
See application file for complete search history.

(56) References Cited

U.S. PATENT DOCUMENTS

| 5,343,107 A | * | 8/1994 | Shikata et al. | .......... 310/313 A |
| 5,497,726 A | * | 3/1996 | Shikata et al. | ................. 117/89 |
| 5,767,687 A | * | 6/1998 | Geist | .......................... 324/664 |

FOREIGN PATENT DOCUMENTS

JP 2002-26685 A 1/2002

OTHER PUBLICATIONS

Michio Kadota; "Boundary Acoustic Wave Device and Process for Producing Same"; U.S. Appl. No. 11/535,560, filed Sep. 27, 2006, currently pending.
Michio Kadota; "Boundary Acoustic Wave Device and Process for Producing Same"; U.S. Appl. No. 11/756,955, filed Jun. 1, 2007, currently pending.
Official communication issued in counterpart Chinese Application No. 200580009757.6, issued on Feb. 6, 2009.

* cited by examiner

*Primary Examiner*—Paul D Kim
(74) *Attorney, Agent, or Firm*—Keating & Bennett, LLP

(57) ABSTRACT

In a method for producing a boundary acoustic wave device that includes a first medium, a second medium, and a third medium laminated in that order, and electrodes disposed at the interface between the first medium and the second medium, the method includes the steps of preparing a laminate including the first medium, the second medium, and the electrodes disposed at the interface between the first medium and the second medium, adjusting the thickness of the second medium after the step of preparing the laminate to regulate a frequency or the acoustic velocity of a surface acoustic wave, a pseudo-boundary acoustic wave, or a boundary acoustic wave, after the adjusting step, forming the third medium different from the second medium in terms of the acoustic velocity with which the boundary acoustic wave propagates therethrough and/or in terms of material.

6 Claims, 6 Drawing Sheets

(MHz)

US 7,581,306 B2

METHOD FOR PRODUCING A BOUNDARY ACOUSTIC WAVE DEVICE

This application is a Divisional Application of U.S. patent application Ser. No. 11/535,560 filed Sep. 27, 2006, now U.S. Pat. No. 7,322,093, which is a Continuation of PCT/JP2005/005414 filed Mar. 24, 2005, expired.

BACKGROUND OF THE INVENTION

1. Field of the Invention

The present invention relates to a boundary acoustic wave device using a boundary acoustic wave propagating through the interface between media and a method for producing the boundary acoustic wave device. More specifically, the present invention relates to a boundary acoustic wave device including electrodes disposed between a first medium and a second medium, and another medium laminated on the outer surface of one of the first and second media, and also relates to a method for producing the boundary acoustic wave device.

2. Description of the Related Art

Various surface acoustic wave devices have been used for RF and IF filters in mobile phones, resonators in VCOs, and VIF filters in television sets. Each of the surface acoustic wave devices use a surface acoustic wave, such as a Rayleigh wave or a first-order leaky wave, propagating along a surface of a medium.

Surface acoustic waves propagate along the surface of a medium, and are thus sensitive to changes in the surface condition of the medium. Accordingly, to protect the surface of the medium along which the surface acoustic waves propagate, in the related art, the surface acoustic wave element is hermetically sealed in a package having a cavity such that the surface of the medium described above is disposed therein. The use of the package having the cavity inevitably increases the cost of the surface acoustic wave device. In addition, the package has significantly larger dimensions than the surface acoustic wave element. Thus, the size of the surface acoustic wave device is relatively large.

Acoustic waves other than the surface acoustic waves include boundary acoustic waves propagating along the boundaries between solids.

For example, "Piezoelectric Acoustic Boundary Waves Propagating Along the Interface Between SiO$_2$ and LiTaO3" IEEE Trans. Sonics and ultrason., Vol. SU-25, No. 6, 1978 IEEE (Non-Patent Document 1) discloses a boundary acoustic wave device including an IDT disposed on a 126°-rotated Y-plate X-propagating LiTaO$_3$ substrate and a SiO$_2$ film having a predetermined thickness disposed over the IDT and the LiTaO$_3$ substrate. This document describes that SV+P mode boundary acoustic waves called Stoneley waves propagate. Non-Patent Document 1 also describes that when the SiO$_2$ film has a thickness of 1.0$\lambda$ (wherein $\lambda$ represents the wavelength of the boundary acoustic wave), the electromechanical coupling coefficient is 2%.

Boundary acoustic waves propagate with their energy concentrated on the boundaries between the solids. Thus, minimal energy is present on the bottom surface of the LiTaO$_3$ substrate and on a surface of the SiO$_2$ film. Therefore, characteristics of the boundary acoustic wave do not vary with changes in the surface state of the substrate or the thin film. Thus, a package having a cavity is not required, thereby reducing the size of the acoustic wave device.

To suppress non-uniformities in resonant frequencies and center frequencies in filters and resonators using the acoustic waves, various methods for adjusting frequencies have been developed. For example, Japanese Unexamined Patent Application Publication No. 5-191193 (Patent Document 1) discloses, in a piezoelectric ceramic filter using the thickness vibration of a bulk wave, a method for adjusting a frequency by evaporating an insulating material onto resonant electrodes disposed on a surface of a piezoelectric ceramic substrate.

Japanese Unexamined Patent Application Publication No. 2-301210 (Patent Document 2) discloses a surface acoustic wave device using a surface acoustic wave, the surface acoustic wave device including a SiN film covering interdigital electrodes and reflectors disposed on a piezoelectric substrate. A center frequency and a resonant frequency are adjusted by controlling the thickness of the SiN film.

WO98/51011 (Patent Document 3) discloses a boundary acoustic wave device shown in FIG. 12. A boundary acoustic wave device 100 includes interdigital electrodes 102 and 102 disposed on a first piezoelectric substrate 101, a dielectric film 103 disposed over the interdigital electrodes 102, and a Si-based second substrate 104 laminated on the upper surface of the dielectric film 103. In the boundary acoustic wave device 100, the Si-based second substrate 104 is disposed on the interdigital electrodes 102 with the dielectric film 103 provided therebetween, and thus is not in direct contact with the interdigital electrodes 102. Therefore, it is possible to reduce the parasitic resistance between the interdigital electrodes 102.

The above-described boundary acoustic wave device does not require a package having a cavity, thereby reducing the size of an acoustic wave device. However, according to experiments conducted by the inventors, production tolerance often induces non-uniformities in a resonant frequency and a center frequency in the boundary acoustic wave devices, as in the case of the surface acoustic wave devices. In particular, in the boundary acoustic wave device, after the formation of the electrodes on a first medium, a second medium was formed so as to cover the electrodes. Thus, if there was production tolerance in the second medium, the frequency of the boundary acoustic wave device would have been likely to vary significantly.

On the other hand, in methods described in Patent Documents 1 and 2, an insulating material is deposited on a surface of a bulk wave substrate by evaporation to adjust the frequency of a bulk wave device. In a method described in Patent Document 2, a SiN film is provided on a surface acoustic wave substrate to adjust the frequency. That is, in a known bulk wave device and surface acoustic wave device, an insulating material or a metal is deposited on a surface of a substrate to adjust a frequency by using the distribution of oscillation energy to the surface of the substrate. Furthermore, in another method, an electrode disposed on a surface of a substrate is etched or a surface of a substrate is etched to adjust a frequency.

However, since the oscillation energy of a boundary wave is scarcely distributed in a boundary acoustic wave device, such a method for adjusting the frequency cannot be used. In other words, if foreign matter such as an insulating material is deposited on a surface of a substrate or if a surface of a substrate is shaved, the resonant frequency and a pass band are not changed.

In the boundary acoustic wave device 100 described in Patent Document 3, interposing the dielectric film 103 reduces parasitic resistance. However, the frequency cannot be adjusted after completion.

SUMMARY OF THE INVENTION

To overcome the problems described above, preferred embodiments of the present invention provide a method for stably and effectively producing a boundary acoustic wave device having target frequency characteristics, the method being able to efficiently suppress variations in frequency caused by production tolerance. Preferred embodiments of the present invention also provide a boundary acoustic wave device having target frequency characteristics with only slight non-uniformity in frequency from lot to lot.

According to a first preferred embodiment of the present invention, in a method for producing a boundary acoustic wave device that includes a first medium, a second medium, and a third medium laminated in that order, and electrodes disposed at the interface between the first medium and the second medium, the method includes the steps of preparing a laminate including the first medium, the second medium, and the electrodes disposed at the interface between the first medium and the second medium, adjusting the thickness of the second medium after the step of preparing the laminate to regulate a frequency or the acoustic velocity of a surface acoustic wave, a pseudo-boundary acoustic wave, or a boundary acoustic wave, and after the adjusting step, forming the third medium different from the second medium in terms of the acoustic velocity with which the boundary acoustic wave propagates therethrough and/or in terms of material.

The third medium preferably has a thickness greater than about 0.5λ, where λ represents the wavelength of the boundary acoustic wave.

According to a second preferred embodiment of the present invention, in a method for producing a boundary acoustic wave device that includes a first medium, a second medium, a third medium, and a fourth medium laminated in that order, and electrodes disposed at the interface between the first medium and the second medium, the method includes the steps of preparing a laminate including the first medium, the second medium, and the third medium formed in that order and electrodes disposed at the interface between the first medium and the second medium, adjusting a frequency or the acoustic velocity of a surface acoustic wave, a pseudo-boundary acoustic wave, or a boundary acoustic wave after the step of preparing the laminate, and after the adjusting step, forming the fourth medium, the acoustic velocity in the fourth medium and/or the material of the fourth medium being different from that of the third medium.

In the first preferred embodiment of the present invention described above, the acoustic velocity in the third medium and/or the material of the third medium is different from that of the second medium, and, in the second preferred embodiment, the acoustic velocity in the fourth medium and/or the material of fourth medium is different from the third medium. In this case, different materials result in different acoustic velocities of a longitudinal wave and a transverse wave. When the same material is used, it is possible to change the acoustic velocity by using different crystalline states or by changing the degree of density if the material is polycrystalline.

Furthermore, when the medium layer is isotropic, the velocity of longitudinal waves in the medium layer, i.e., Vs, and the velocity of transverse waves, i.e., Vp, are represented by equations (1) and (2):

$$Vs = \sqrt{\frac{C11 - C12}{2\rho}} \quad (1)$$

$$Vp = \sqrt{\frac{C11}{\rho}} \quad (2)$$

where C11 and C12 each represent an elastic stiffness constant; and ρ represents a density. In the second preferred embodiment of the present invention, the fourth medium preferably has a thickness greater than about 0.5λ, where λ represents the wavelength of a boundary acoustic wave.

In the first and second preferred embodiments of the present invention, at least one medium preferably has a laminated structure in which a plurality of material layers are laminated.

In the first and second preferred embodiments of the present invention, the electrodes are preferably each composed of one metal selected from the group consisting of Au, Ag, Cu, Fe, Ta, W, Ti, and Pt.

In the first and second preferred embodiments of the present invention, the medium layers are preferably each composed of at least one material selected from the group consisting of lithium niobate, potassium niobate, lithium tantalate, lithium tetraborate, langasite, langanite, quartz, lead zirconate titanate ceramics, ZnO, AlN, silicon oxides, glass, silicon, sapphire, silicon nitrides, and carbon nitrides.

In the first and second preferred embodiments of the present invention, the electrodes preferably define a boundary acoustic wave resonator or a boundary acoustic wave filter, and the boundary acoustic wave device is the boundary acoustic wave resonator or the boundary acoustic wave filter.

According to a third preferred embodiment of the present invention, a boundary acoustic wave device includes a first medium, a second medium, a third medium, and a fourth medium laminated in that order, and electrodes disposed at the interface between the first medium and the second medium, the acoustic velocity in the third medium and/or the material of the third medium being different from that of the fourth medium.

In the production method according to the first preferred embodiment of the present invention, after preparing the laminate including the first medium, the second medium, and the electrodes disposed at the interface between the first medium and the second medium, the thickness of the second medium is adjusted after the step of preparing the laminate to regulate a frequency or the acoustic velocity of a boundary acoustic wave. After the adjusting step, the third medium is formed, the third medium being different from the second medium in terms of the acoustic velocity with which the boundary acoustic wave propagates therethrough and/or in terms of material. That is, the laminate including the electrodes disposed between the first and the second media is prepared, and then the thickness of the second medium is adjusted after the step of preparing the laminate. Thereby, it is possible to regulate a frequency or the acoustic velocity of a surface acoustic wave, a pseudo-boundary acoustic wave, or a boundary acoustic wave. Thus, it is possible to produce a laminate for forming a boundary acoustic wave device having a target frequency. In this case, to adjust the second medium after the step of preparing the laminate to regulate the frequency or the acoustic velocity, the thickness of the second medium may be adjusted in producing the laminate. Alternatively, the thickness of the second medium may be adjusted after the completion of the laminate.

After the adjusting step, the third medium, in which the acoustic velocity in the third medium and/or the material of the third medium is different from that of the second medium, is formed. The energy of the boundary acoustic wave is negligibly distributed in the third medium. Thus, even if variation of the third medium from lot to lot occurs, variations in acoustic velocity and frequency do not occur. Consequently, it is possible to easily and reliably provide a boundary acoustic wave device having minimal non-uniformity in device characteristics.

In the production method according to the first preferred embodiment of the present invention, after preparing the laminate including the first medium, the second medium, and the third medium formed in that order and electrodes disposed at the interface between the first medium and the second medium, the thickness of the third medium is adjusted after the step of preparing the laminate to regulate a frequency or the acoustic velocity of a boundary acoustic wave. After the adjusting step, the fourth medium is formed, the acoustic velocity in the fourth medium and/or the material of the fourth medium being different from that of the third medium. That is, the laminate including the electrodes disposed between the first and the second media, and the third medium laminated on the second medium is prepared, and then the thickness of the third medium is adjusted after the step of preparing the laminate. Thereby, it is possible to regulate a frequency or the acoustic velocity of a surface acoustic wave, a pseudo-boundary acoustic wave, or a boundary acoustic wave. Thus, it is possible to produce a laminate for forming a boundary acoustic wave device having a target frequency. In this case, to adjust the third medium after the step of preparing the laminate to regulate the frequency or the acoustic velocity, the thickness of the third medium may be adjusted in producing the laminate. Alternatively, the thickness of the third medium may be adjusted after the completion of the laminate.

After the adjusting step, the fourth medium, in which the acoustic velocity in the fourth medium and/or the material of the fourth medium is different from that of the third medium, is formed. The energy of the boundary acoustic wave is negligibly distributed in the fourth medium. Thus, even if variations of the fourth medium from lot to lot occur, variations in acoustic velocity and frequency do not occur. Consequently, it is possible to easily and reliably provide a boundary acoustic wave device having minimal non-uniformity in device characteristics.

In a boundary acoustic wave propagating through the boundary acoustic wave device according to the first and second preferred embodiments of the present invention, the vast majority of the energy is distributed in the range up to about $0.5\lambda$ thickness of the third medium in the first preferred embodiment or the fourth medium in the second preferred embodiment of the present invention. Thus, the third medium in the first preferred embodiment and the fourth medium in the second preferred embodiment of the present invention preferably have a thickness of at least about $0.5\lambda$.

When at least one medium has a laminated structure in which a plurality of material layers are laminated, the selection of the plurality of the material layers facilitate forming medium layers having different acoustic velocities therein or different frequency characteristics.

When the electrodes are each composed of one metal selected from the group consisting of Au, Ag, Cu, Fe, Ta, W, Ti, and Pt, the metal is used as a material for the propagation path, the IDT, and the reflector of the boundary wave device.

In the medium layers each composed of at least one material selected from the group consisting of lithium niobate, potassium niobate, lithium tantalate, lithium tetraborate, langasite, langanite, quartz, lead zirconate titanate ceramics, ZnO, AlN, silicon oxides, glass, silicon, sapphire, silicon nitrides, and carbon nitrides, the thickness of the metal material and the duty ratios of the IDT and the reflector are adjusted such that the acoustic velocity of the boundary wave is less than those in the materials of the media, thereby producing a boundary wave device.

When the electrodes define a boundary acoustic wave resonator or a boundary acoustic wave filter, the boundary acoustic wave resonator or the boundary acoustic wave filter can be produced according to preferred embodiments of the present invention.

In the boundary acoustic wave device according to preferred embodiments of the present invention, the first medium, the second medium, and the third medium are laminated in that order. The electrodes are disposed at the interface between the first and second media. The acoustic velocity in the second medium and/or the material of the second medium is different from that of the third medium. The energy of the boundary wave is distributed as shown in FIG. 5. Thus, changing the thickness of the second medium adjusts the acoustic velocity with which the boundary wave propagates therethrough. Changing the thickness of the third medium does not adjust the acoustic velocity with which the boundary wave propagates therethrough because the energy of the boundary wave is not distributed on the surface of the third medium. An operating frequency F of the boundary wave device is expressed as $F=V/\lambda$, where V represents the acoustic velocity of a boundary wave, and $\lambda$ represents the period of IDT strips. Thus, adjusting the acoustic velocity regulates the operating frequency of the boundary wave device.

In the second preferred embodiment of the present invention, the first medium, the second medium, the third medium, and the fourth medium are laminated in that order. The electrodes are disposed at the interface between the first and second media. The acoustic velocity in the third medium and/or the material of the third medium is different from that of the fourth medium. The energy of the boundary wave is distributed as shown in FIG. 6. Thus, changing the thickness of the third medium adjusts the acoustic velocity with which the boundary wave propagates therethrough. Changing the thickness of the fourth medium does not adjust the acoustic velocity with which the boundary wave propagates therethrough because the energy of the boundary wave is not distributed on the surface of the fourth medium. An operating frequency F of the boundary wave device is expressed as $F=V/\lambda$, where V represents the acoustic velocity of a boundary wave, and $\lambda$ represents the period of IDT strips. Thus, adjusting the acoustic velocity regulates the operating frequency of the boundary wave device.

In the second preferred embodiment of the present invention, the second and fourth media may be composed of the same material, thereby improving various characteristics. In general, many dielectric materials and metal materials have negative temperature coefficients of acoustic velocities of acoustic waves. When the first to third media and the electrode layer are each composed of a material having a negative temperature coefficient, the boundary acoustic wave has a negative temperature coefficient. The temperature coefficient of operating frequency of a boundary acoustic wave device, i.e., TCF, is expressed as:

$$TCF = \frac{1}{V} \cdot \frac{\Delta V}{\Delta T} - \alpha$$

where V represents the acoustic velocity of a boundary wave, $\Delta V$ represents the width of variation in acoustic velocity, $\Delta T$ represents the width of variation in temperature, and $\alpha$ represents a coefficient of linear thermal expansion. Many dielectric materials and metal materials have positive coefficients of linear thermal expansion. Thus, the boundary acoustic wave device has a negative TCF. In the boundary acoustic wave device, the TCF is preferably zero.

To improve the temperature characteristics, the second and fourth media may each be composed of $SiO_2$ having a positive temperature coefficient. In this case, it is possible to adjust the temperature coefficient closer to zero as compared to the case in which the second medium is composed of a dielectric material having a negative temperature coefficient. Furthermore, the appropriate selection of the materials of the first and third media and the thickness of each media can adjust the TCF to zero.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention will be explained by describing specific preferred embodiments according to the present invention with reference to the drawings.

Figure 2A:
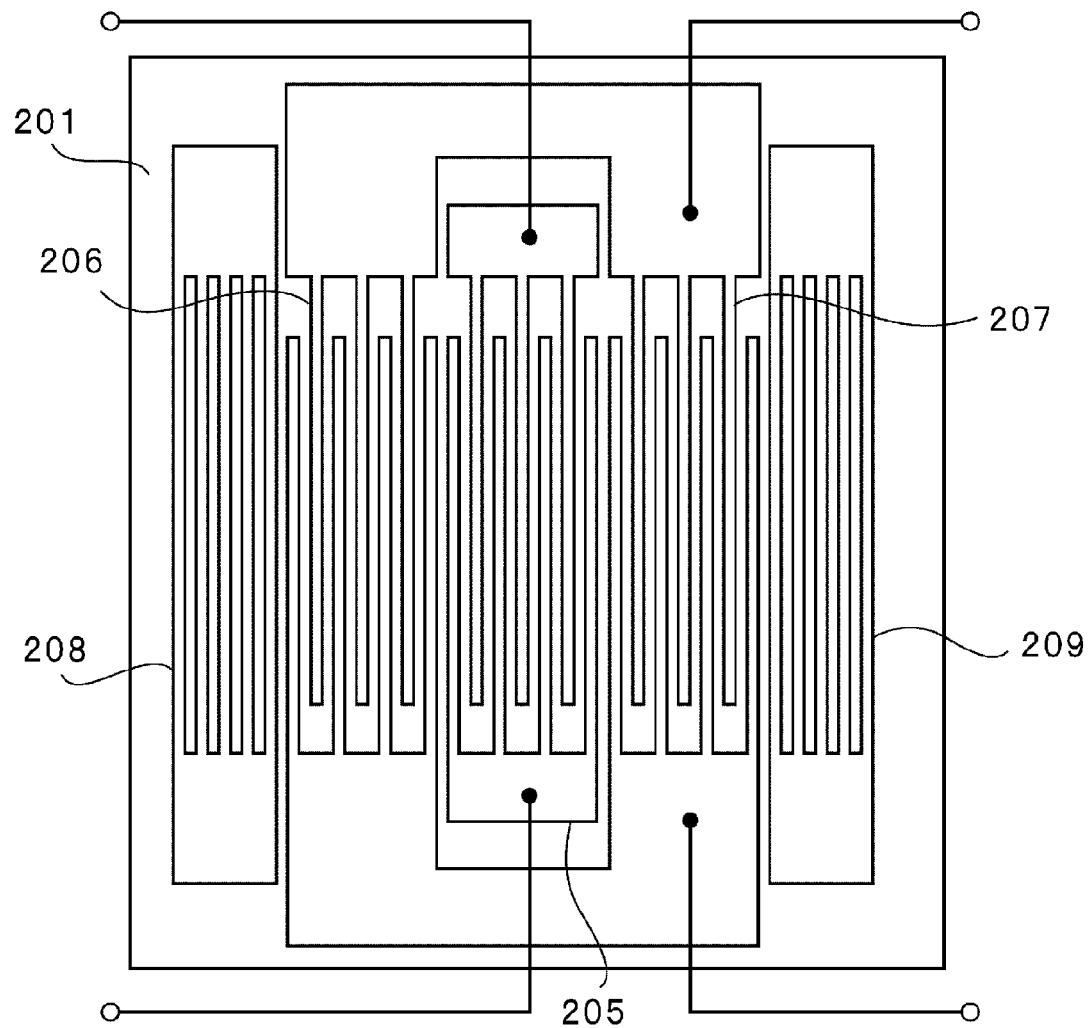
FIG. 2A is a plan view showing an electrode structure of a boundary acoustic wave device according to a preferred embodiment of the present invention.
Figure 2B:
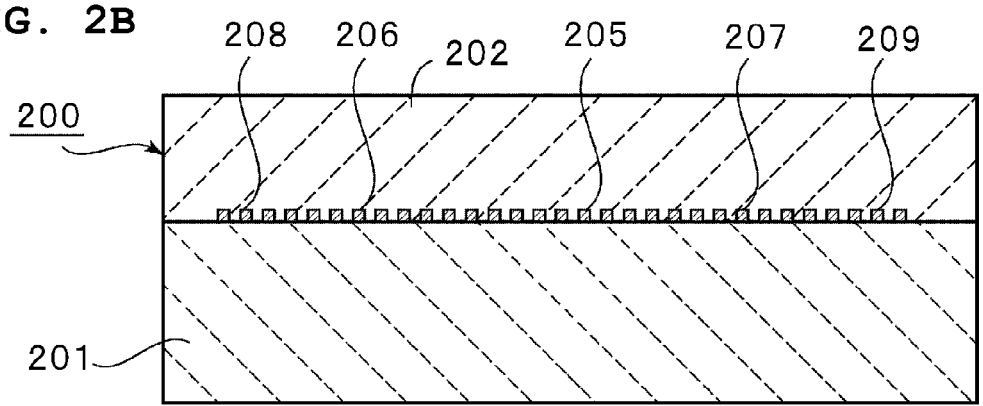
FIG. 2B is a front cross-sectional view of the boundary acoustic wave device.

The inventors have produced a boundary acoustic wave device shown in FIGS. 2A and 2B and have studied the device. FIG. 2B is a front cross-sectional view of the boundary acoustic wave device 200. The boundary acoustic wave device 200 has a laminated structure including a first medium 201 and a second medium 202. An input IDT 205, output IDTs 206 and 207, which function as electrodes, and reflectors 208 and 209 are disposed at the interface between the first and second media 201 and 202. FIG. 2A is a plan view showing the electrode structure.

In the boundary acoustic wave device 200, the first medium 201 was a 15° Y-cut X-propagating $LiNbO_3$ substrate. A wavelength λ based on the center-to-center distance of the IDTs 205 to 207 was about 3.0 μm. The cross length of electrode fingers was about 50λ. The input IDT 205 had 14.5 pairs of electrode fingers. The period of arrangement of the four outer electrode fingers of the IDT 204 in the propagation direction of a boundary wave was about 0.86λ. The output IDTs 206 and 207 each had 8.5 pairs of electrode fingers, the period of arrangement of four electrode fingers adjacent to the input IDT 205 was about 0.86λ. The reflectors 208 and 209 each had 41 electrode fingers and a period of arrangement of about 1.033λ. Pass-band regions of the filter were disposed in reflection-band regions of the reflectors 208 and 209. The center-to-center distances of the nearest-neighbor electrodes between the input IDT 205 and each of the output IDTs 206 and 207 were about 0.43λ. The center-to-center distance of the nearest-neighbor electrodes between the output IDT 206 and the reflector 208 and between the output IDT 207 and the reflector 209 was about 0.5λ. The IDTs 205 to 207 and the reflectors 208 and 209 each had a duty ratio of about 0.5.

Figure 3:
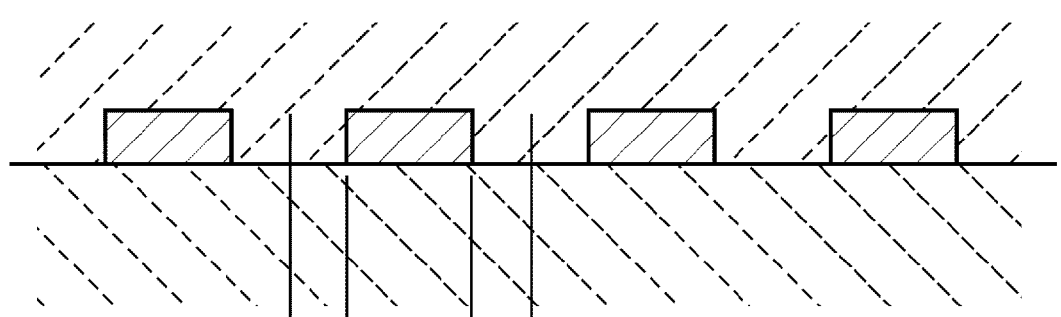
FIG. 3 is a schematic fragmentary enlarged cross-sectional view illustrating duty ratios of the IDT and reflectors of a boundary acoustic wave device.

FIG. 3 is a schematic cross-sectional view illustrating the duty ratio. The term "duty ratio" means a value expressed as L/P in FIG. 3, where L represents the width of an electrode finger; and P represents the center-to-center distance of the spaces between adjacent electrode fingers in the propagation direction of the boundary wave. The period of arrangement of the IDT and the reflector, i.e., λ, is expressed as λ=2×P.

Each of the above-described electrodes were made of a laminate including an underlying NiCr film having a thickness of about 0.003λ and an Au film having a thickness of about 0.05λ disposed on the underlying NiCr film. The second medium was made of a $SiO_2$ film.

Two boundary acoustic wave devices described above were produced. That is, a first lot and a second lot of the boundary acoustic wave devices were produced.

Figure 13:
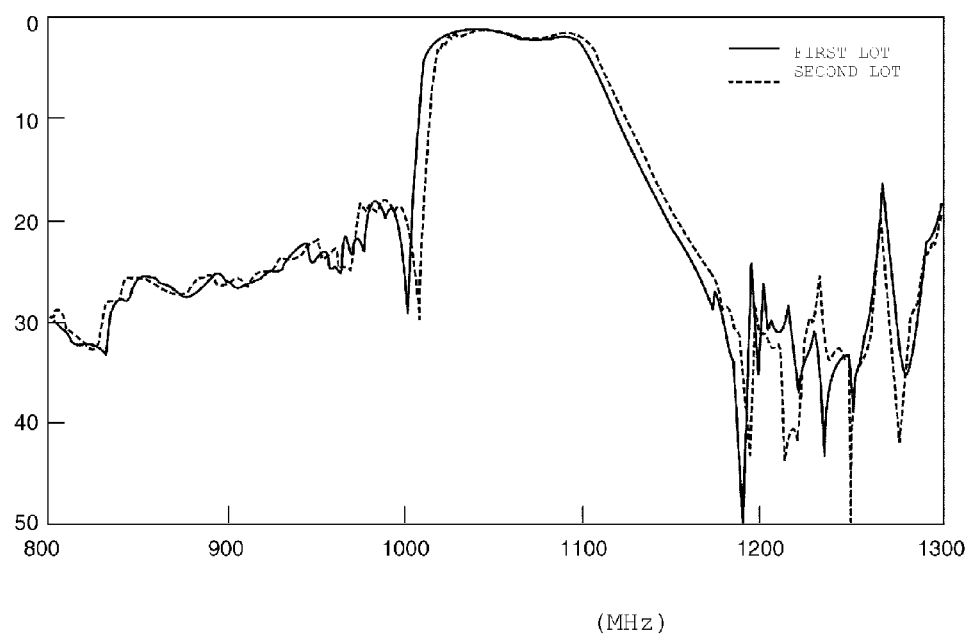
FIG. 13 is a graph showing frequency characteristics of the known boundary acoustic wave device and shows production tolerance in frequency.

S21 characteristics (transmission characteristics) of the boundary acoustic wave devices of the first and second lots were measured. As shown in FIG. 13, the results demonstrated that the mean center frequency of the pass band of the first lot was different from that of the second lot by about 5.6 MHz.

The center frequency of the pass band of the filter must be matched to a target center frequency. Variations in the frequency of the pass band must be suppressed with high precision. A first lot and a second lot of the boundary acoustic wave devices were produced again in the same manner as the first and second lots. The pass frequencies were measured before and after the formation of the $SiO_2$ films as the second media. Table 1 shows the results.

TABLE 1

|  | First lot | Second lot |
| --- | --- | --- |
| Before formation of $SiO_2$ film | 844 MHz | 847 MHz |
| After formation of $SiO_2$ film | 1,060 MHz | 1,065 MHz |

As shown in Table 1, the width of variation in frequency was as large as about 220 MHz before and after the formation of the SiO₂ film in each of the first and second lots. A comparison of a result of the boundary acoustic wave device of the first lot with that of the second lot show that the frequency difference was further increased by 2 MHz after the formation of the SiO₂ film. Thus, the results demonstrate that production tolerance of the SiO₂ film, which is the second medium, significantly affects variation in the frequency of the final boundary acoustic wave device.

In the case of the formation of the SiO₂ film functioning as the second medium after the formation of the electrodes on the first medium as described above, the occurrence of variation in the second medium causes significant variation in the frequency of the boundary acoustic wave device.

In contrast, according to the first preferred embodiment of the present invention, the frequency adjustment is performed after the formation of a second medium of a laminate. Thus, production tolerance in frequency is significantly reduced after the step of adjusting the frequency. In the case in which a third medium is further formed, even when variation in the third medium occurs, variation in the frequency of the resulting boundary acoustic wave device is effectively minimized and suppressed. This will be explained with reference to FIGS. 1, 4, and 5.

Figure 1:
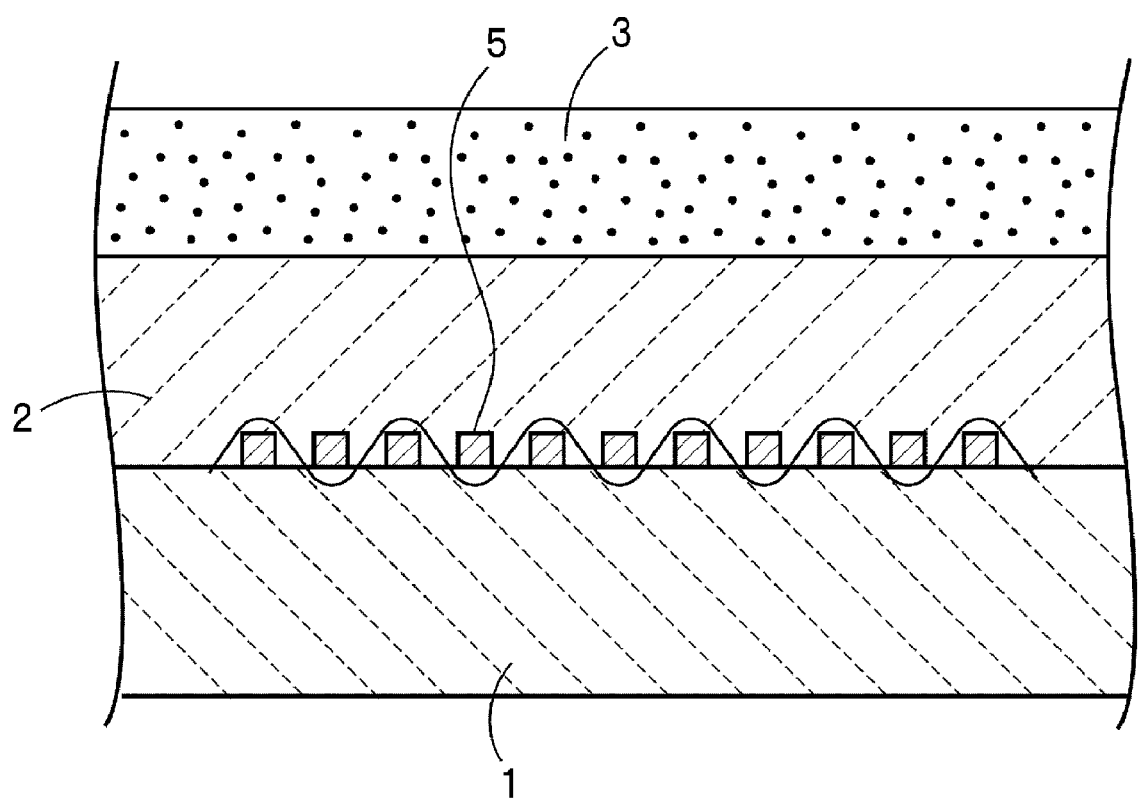
FIG. 1 is a schematic front cross-sectional view illustrating a boundary acoustic wave device according to a preferred embodiment of the present invention.

FIG. 1 is a partially cutout front cross-sectional view of a boundary acoustic wave device according to a preferred embodiment of the present invention. In this boundary acoustic wave device, a second medium 2 and a third medium 3 are laminated on a first medium 1. Electrodes 5 are disposed at the interface between the first medium 1 and the second medium 2. In this preferred embodiment, after the formation of the electrodes 5 on the first medium, the second medium 2 is formed, thus producing a laminate. After the step of forming the laminate, the frequency adjustment is performed. More specifically, the frequency is adjusted by changing the thickness of the second medium 2. Examples of methods of changing the thickness of the second medium 2 include a method in which the second medium 2 is processed by etching to reduce the thickness; and a method in which a film composed of a material identical to that of the second medium is formed by a film-forming process such as sputtering to substantially increase the thickness of the second medium 2. Alternatively, the thickness of the second medium 2 may be adjusted in the step of forming the second medium 2.

In this preferred embodiment, after the thickness adjustment, the third medium 3 is formed.

Methods for producing the second medium 2 and the third medium 3 are not limited to film-forming methods, such as sputtering, and various other methods may be used. With respect to the third medium 3, a separately prepared film or a plate formed of the third medium may be bonded on the second medium 2.

In the boundary acoustic wave device according to a first preferred embodiment of the present invention, the third medium 3 must be different from the second medium 2 in terms of the acoustic velocity with which a boundary wave propagates therethrough and/or in terms of material. In the case where the acoustic velocity in the second medium 2 is identical to that of the third medium 3, and where the material of the second medium 2 is identical to that of the third medium 3, even when the above-described step of adjusting the frequency is performed, in some cases, the frequency is not changed.

Figure 4:
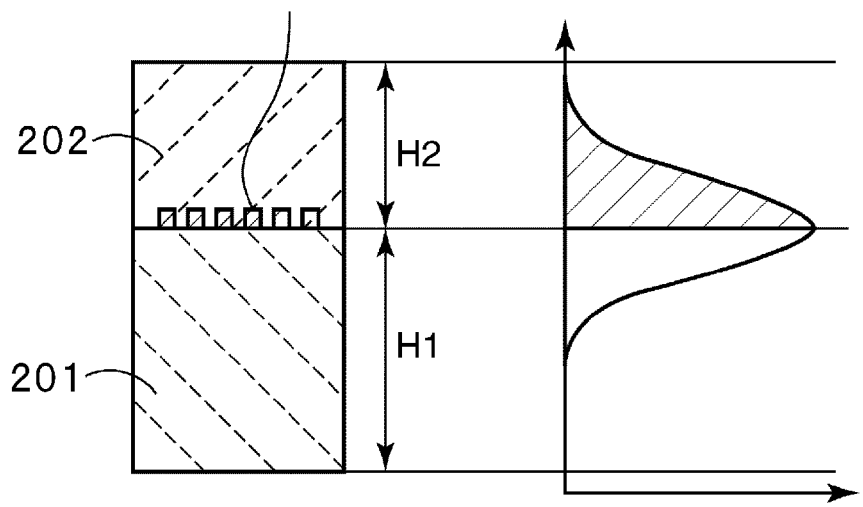
FIG. 4 shows the relationship between the cross-sectional structure of a known boundary acoustic wave device and the energy distribution of a boundary acoustic wave.

FIG. 4 shows the relationship between a schematic front cross-sectional view of a known boundary acoustic wave device and the energy distribution of a boundary acoustic wave. As is apparent from FIG. 4, in the boundary acoustic wave device 200, electrodes such as the input IDT 205 are disposed between the first medium 201 having a thickness of H1 and the second medium 202 having a thickness of H2. As shown on the right side of FIG. 4, the energy of the boundary wave is concentrated on and around the interface. In the first and second media 201 and 202, the energy decreases as the distance from the interface increases. However, for example, in the second medium 202, the energy is also present in the hatched portion in FIG. 4. Thus, the occurrence of the variation in the second medium after the formation of the second medium 202 results in variation in frequency.

Figure 5:
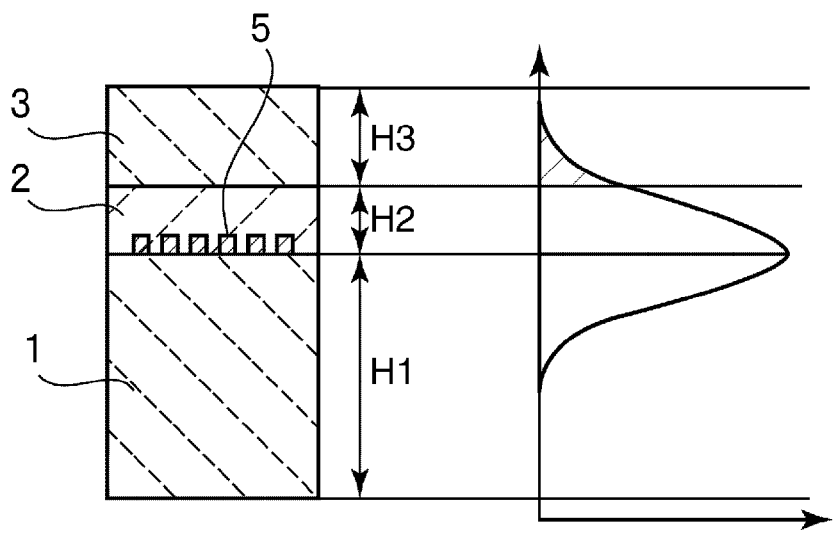
FIG. 5 shows the relationship between a cross-sectional structure of a boundary acoustic wave device according to a preferred embodiment of the present invention and the energy distribution of a boundary acoustic wave.

FIG. 5 shows the relationship between a schematic cross-sectional view of the boundary acoustic wave device of the above-described preferred embodiment and the energy distribution of a boundary acoustic wave.

In the boundary acoustic wave device shown in FIG. 5, the electrodes 5 are disposed at the interface between the first medium 1 having a thickness of H1 and the second medium 2 having a thickness of H2. In this case, the electrodes 5 are formed on the first medium 1. Then, the second medium 2 is formed. After the step of forming the second medium 2, the frequency adjustment is performed. After the frequency adjustment, the third medium 3 having a thickness of H3 is formed. In the resulting boundary acoustic wave device, after the step of forming the laminate having the first medium 1 and the second medium 2, the frequency adjustment is performed.

With respect to the energy distribution of the boundary wave in the boundary acoustic wave device, only a portion of energy is distributed in the third medium 3 as shown in the right side of FIG. 5. Thus, even when variation in the third medium 3 from production tolerance occurs, non-uniformity in frequency due to the variation is very small. Therefore, the frequency adjustment before the formation of the third medium 3 significantly reduces variation in the frequency of the boundary acoustic wave device after the formation of the third medium 3.

Figure 6:
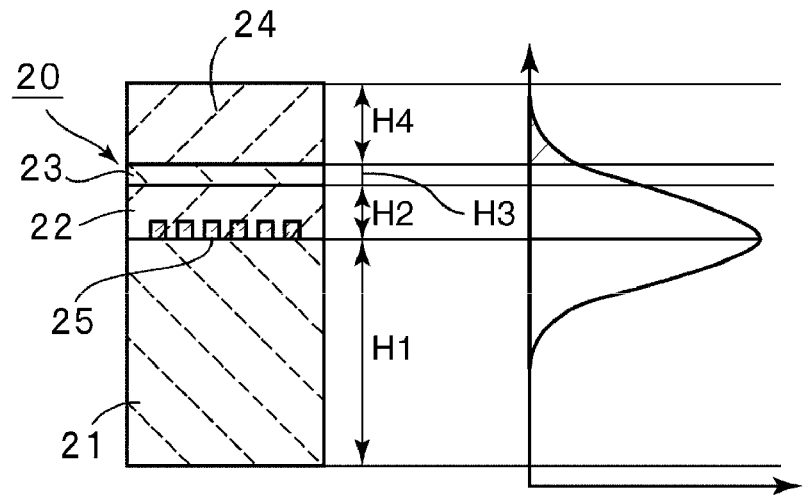
FIG. 6 shows the relationship between a cross-sectional structure of a boundary acoustic wave device according to another preferred embodiment of the present invention and the energy distribution of a boundary acoustic wave.

FIG. 6 shows the relationship between a schematic cross-sectional view illustrating the reason for the small variation in the frequency of a boundary acoustic wave device according to a second preferred embodiment of the present invention and the energy distribution of a boundary acoustic wave.

In a boundary acoustic wave device 20 according to the second preferred embodiment of the present invention, electrodes 25 are disposed between a first medium 21 having a thickness of H1 and a second medium 22 having a thickness of H2. A third medium 23 having a thickness of H3 is laminated thereon to form a laminate. After the step of forming the laminate, the frequency adjustment is performed. A fourth medium 24 having a thickness of H4 is laminated on the third medium 23. In the resulting boundary acoustic wave device 20, the energy distribution of a boundary wave is shown on the right side of FIG. 6. That is, only a portion of energy is distributed in the fourth medium. Thus, in the case where after the step of forming the laminate having the third medium 23, the frequency adjustment is performed to significantly reduce variation in frequency, even when the fourth medium 24 is further formed thereon, it is possible to suppress variation in frequency.

In the second preferred embodiment of the present invention, the third medium 23 must be different from the fourth medium 24 in terms of the acoustic velocity with which a boundary wave propagates therethrough and/or in terms of material, otherwise the frequency is not changed.

As described above, variation in frequency is minimized in the production process according to the first and second preferred embodiments of the present invention because the frequency adjustment is performed before the third or fourth medium is formed, and then the third or fourth medium is formed. That is, only a portion of energy of a boundary wave is distributed in the third medium according to the first preferred embodiment of the present invention and the fourth medium according to the second preferred embodiment of the present invention. Thus, even when production tolerance in the third medium according to the first preferred embodiment of the present invention and production tolerance in the fourth medium according to the second preferred embodiment of the present invention occur, these production tolerances have less effect on variation in the frequency of a final boundary acoustic wave device. Therefore, it is possible to provide a boundary acoustic wave device having minimal variation in frequency by performing the frequency adjustment after the step of forming the laminate.

In the second preferred embodiment of the present invention, the second medium 22 may be composed of a material identical to that of the fourth medium 24 or may it be composed of a material different from that of the fourth medium 24. For example, in the case where the second medium 22 is composed of $SiO_2$, which has a positive temperature coefficient of frequency, combining $SiO_2$ with various materials each having a negative temperature coefficient of frequency improves the temperature coefficient of frequency of the boundary wave device. In the first preferred embodiment of the present invention, when one of the second medium 2 and the third medium 3 is composed of $SiO_2$, the other is preferably composed of a material having a negative temperature coefficient of frequency other than $SiO_2$. Both second and third media 2 and 3 may be composed of $SiO_2$. In this case, it is necessary that $SiO_2$ media having different densities, hardness (elastic constant), and other properties be used to provide different acoustic velocities. Thus, the effect of improving the temperature coefficient of frequency may be degraded. Therefore, in the first preferred embodiment of the present invention, either of the second medium 2 and the third medium 3 is preferably composed of $SiO_2$.

In the second preferred embodiment of the present invention, when the second medium 22 and the fourth medium 24 are each composed of $SiO_2$, the third medium 23 may be composed of a material other than $SiO_2$. Thus, it is possible to perform the frequency adjustment while maintaining the effect of improving the temperature coefficient of frequency.

In the first preferred embodiment of the present invention, the thickness H2 ($\lambda$) of the second medium is preferably about 1$\lambda$ or less. When the second medium has a thickness of about 1$\lambda$ or less, the energy of a boundary acoustic wave is negligibly distributed in the third medium. Thus, it is possible to effectively reduce variation in frequency due to production tolerance in the third medium. Furthermore, the thickness H3 of the third medium is preferably greater than about 0.5$\lambda$. At a thickness of the third medium greater than about 0.5$\lambda$, as shown in FIG. 5, even when the energy of a boundary wave is distributed in the third medium, the energy of the boundary wave is reduced until the boundary wave reaches one surface of the third medium 3 opposite the other surface being in contact with the second medium 2, thereby resulting in satisfactory boundary wave propagation. In such a structure, even when foreign matter is attached on the surface, the characteristics of the boundary wave device are stable.

In the second preferred embodiment of the present invention, at a thickness H2 of the second medium of about 0.5$\lambda$ or less, as shown in FIG. 6, the energy of a boundary wave is distributed in the third medium. Furthermore, at a thickness H3 of the third medium of about 0.1$\lambda$ or less, the energy of the boundary wave is also distributed in the fourth medium. The acoustic velocity in the third medium is different from those in the second and fourth media. Thus, adjusting the thickness of the third medium regulates the acoustic velocity with which a boundary wave propagates therethrough. When the energy of a boundary wave is not distributed in the third medium because the second medium has a large thickness, the acoustic velocity with which the boundary wave propagates therethrough cannot be regulated by changing the state of the third medium. When the energy of the boundary wave is not distributed in the fourth medium because the third medium has a large thickness, the acoustic velocity with which the boundary wave propagates therethrough cannot be regulated by changing the thickness of the fourth medium.

As shown in FIG. 6, the energy of the boundary wave is reduced until the boundary wave reaches the surface of the medium 4 opposite the surface being in contact with the medium 3, thereby resulting in satisfactory boundary wave propagation. With such a structure, even when foreign matter is attached on the surface, the characteristic of the boundary wave device are stable.

Specific examples will be described below.

EXAMPLE 1

A 15° Y-cut X-propagating $LiNbO_3$ substrate was prepared as a first medium. The electrode structure shown in FIG. 2 was formed on the $LiNbO_3$ substrate. That is, the input IDT 205, the output IDTs 206 and 207, and the reflectors 208 and 209 shown in FIG. 2A were formed. The electrodes were made using the following procedure: after washing the $LiNbO_3$ substrate, a resist was spin-coated thereon, prebaked, and developed to form a resist pattern. A NiCr film and then an Au film were formed in that order by vacuum evaporation. The resist was lifted-off. The resulting electrodes were washed. Thereby, the electrode structure including the Au film having a thickness of about 0.055$\lambda$ and the NiCr film having a thickness of about 0.001$\lambda$ was obtained.

Next, a $SiO_2$ film as a second medium and having a thickness of about 0.1$\lambda$ was formed over the surface having the electrodes of the $LiNbO_3$ substrate by RF sputtering, thereby producing a laminate shown in FIG. 2B.

A resist was spin-coated on the $SiO_2$ film and then developed to form a resist pattern. Reactive ion etching and the removal of the resist were performed to remove the $SiO_2$ film disposed on the electrodes to be electrically connected with the exterior.

The resulting exposed external terminals were brought into contact with probes of a wafer prober to measure a center frequency. The $SiO_2$ film was processed such that the resulting measurement corresponds to a target center frequency. In this step, the $SiO_2$ film was processed by a method in which the $SiO_2$ film was etched by reactive ion etching to reduce the thickness or a method in which a $SiO_2$ film was formed by sputtering to increase the thickness.

That is, when the measurement was less than the target center frequency, the thickness of the $SiO_2$ film was reduced as described above. In contrast, when the measurement was greater than the target center frequency, the thickness of the $SiO_2$ film was increased.

At this point, a propagating boundary wave was not a boundary acoustic wave but a surface acoustic wave, in which displacement was concentrated on the surface. The frequency adjustment was performed for the surface acoustic wave.

After the frequency adjustment, a polycrystalline Si film having a thickness of about 1$\lambda$ was formed as a third medium by sputtering on the $SiO_2$ film.

At this point, a propagating boundary wave was a boundary acoustic wave.

A resist was spin-coated on the polycrystalline Si film, developed, baked, and patterned by reactive ion etching. The resist was removed, and then polycrystalline Si deposited on the external terminals was removed. Thereby, many boundary acoustic wave devices were produced.

The resulting boundary acoustic wave devices have a small variation in resonant frequency.

Figure 7:
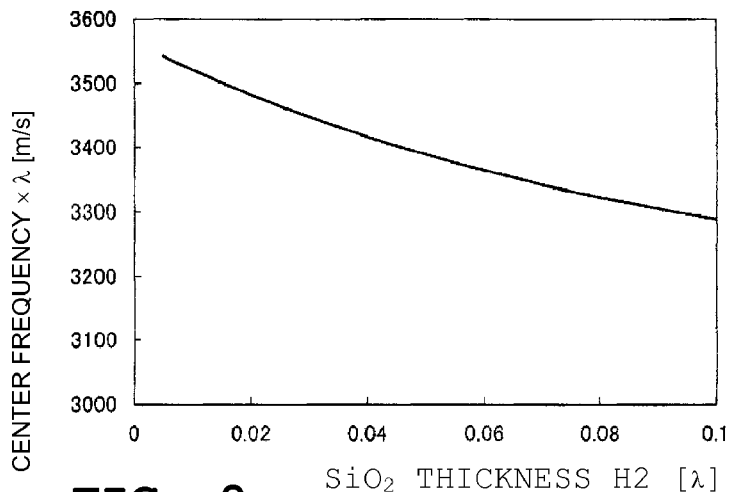
FIG. 7 is a graph showing the relationship between the thickness H2 of a $SiO_2$ film, which is a second medium of a boundary acoustic wave device in Example 1, and the acoustic velocity (center frequency×λ).
Figure 8:
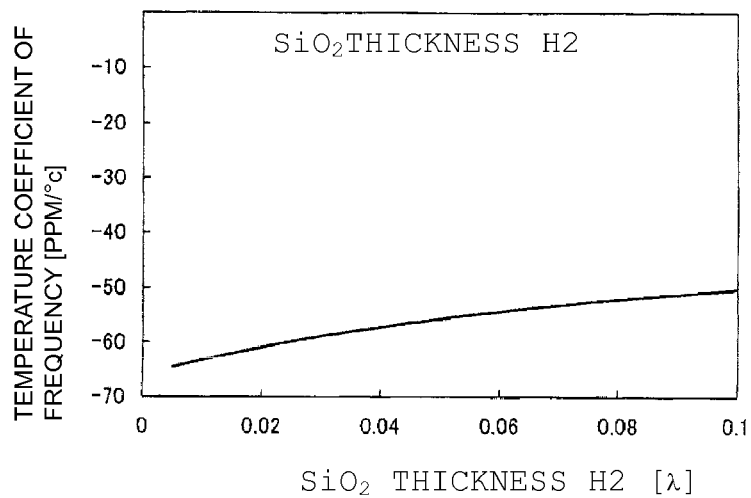
FIG. 8 is a graph showing the relationship between the thickness H2 of a $SiO_2$ film, which is a second medium of a boundary acoustic wave device in Example 1, and the temperature coefficient of frequency.

FIG. 7 is a graph showing the relationship between the thickness H2 of the $SiO_2$ film of the boundary acoustic wave device produced in this example and the acoustic velocity, which is determined by multiplying the center frequency by $\lambda$, in the boundary wave device. FIG. 8 is a graph showing the relationship between the thickness H2 of the $SiO_2$ film and the temperature coefficient of frequency (TCF)(ppm/° C.). The thickness of the polycrystalline Si film functioning as the third medium is unrelated to the acoustic velocity because of the boundary acoustic wave device.

FIG. 7 clearly shows that the acoustic velocity decreases as the thickness of the $SiO_2$ film defining the second medium is increased. FIG. 8 clearly shows that the temperature coefficient of frequency (TCF) is improved as the thickness H2 of the $SiO_2$ film is increased.

EXAMPLE 2

A 15° Y-cut X-propagating $LiNbO_3$ substrate was prepared as a first medium. The electrode structure shown in FIG. 2A was formed as in EXAMPLE 1. Many $LiNbO_3$ substrates each having the electrodes were prepared.

A $SiO_2$ film was formed over the electrodes disposed on the $LiNbO_3$ substrate by RF sputtering. In this case, structures having the $SiO_2$ films with thicknesses of about 0.1$\lambda$, about 0.3$\lambda$, about 0.5$\lambda$, and about 1.0$\lambda$ were produced. Then, a polycrystalline Si film having a thickness of about 0.5$\lambda$ was formed on each $SiO_2$ film by RF sputtering. Thereby, a laminate having a laminated structure of poly-Si/$SiO_2$/electrodes/$LiNbO_3$ substrate, i.e., the laminate of third medium/second medium/electrodes/first medium was prepared.

At this point, a propagating boundary wave was not a boundary acoustic wave but a surface acoustic wave, in which displacement was concentrated on the surface. The frequency adjustment was performed for the surface acoustic wave.

A resist was spin-coated on the resulting polycrystalline Si film of the laminate, prebaked, and patterned. Reactive ion etching and the removal of the resist were performed to remove polycrystalline Si and $SiO_2$ disposed on external terminals, thereby exposing the external terminals. The exposed external terminals were brought into contact with probes of a wafer prober to measure a center frequency.

The polycrystalline Si was processed such that the resulting measurement corresponds to a target center frequency. In this step, when the measurement was less than the target center frequency, the polycrystalline Si was processed to reduce the thickness by reactive ion etching. In contrast, when the measurement was greater than the target center frequency, polycrystalline Si film was formed again by sputtering to increase the thickness of the polycrystalline Si film. After the frequency adjustment, a $SiO_2$ film having a thickness of about 1$\lambda$ was formed as a fourth medium by sputtering on the polycrystalline Si.

At this point, a propagating boundary wave was a boundary acoustic wave.

A resist was spin-coated on the $SiO_2$ film and patterned. Reactive ion etching and the removal of the resist were performed to remove the $SiO_2$ film disposed on the external electrodes. In this manner, many boundary acoustic wave devices were produced.

The center frequencies of the resulting boundary acoustic wave devices were measured. Variations in center frequencies of the boundary acoustic wave devices including the second media having thicknesses of about 0.1$\lambda$, about 0.3$\lambda$, about 0.5$\lambda$, and about 1.0$\lambda$ decrease with increasing thickness.

Figure 9:
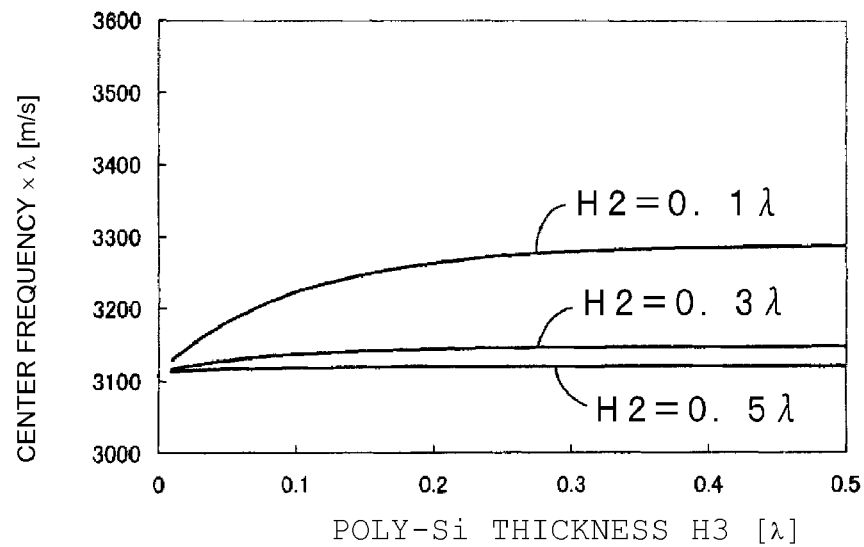
FIG. 9 is a graph showing the relationship between the thickness H3 of a polycrystalline Si film, which is a third medium of a boundary acoustic wave device in Example 2, and the acoustic velocity (center frequency×λ).
Figure 10:
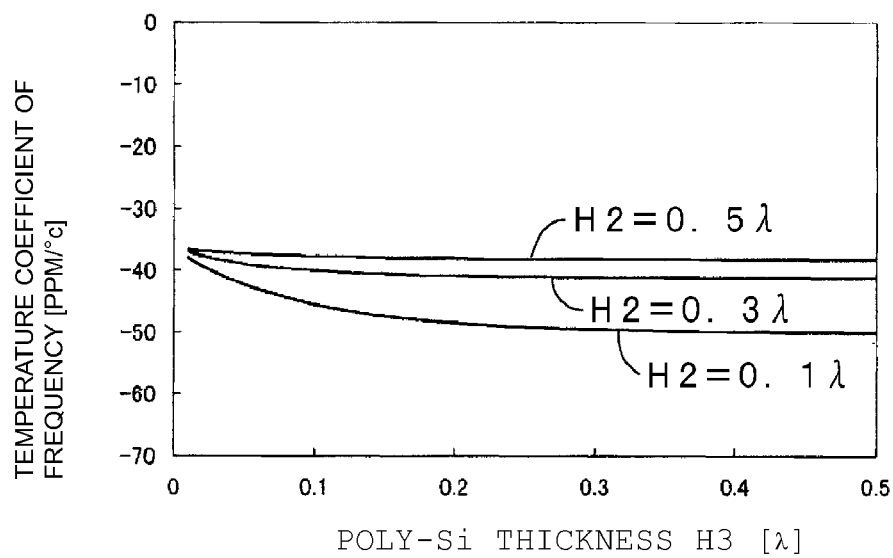
FIG. 10 is a graph showing the relationship between the thickness H3 of a polycrystalline Si film, which is a third medium of a boundary acoustic wave device in Example 2, and the temperature coefficient of frequency.

FIG. 9 is a graph showing the relationship between the thickness H3 of polycrystalline Si film, defining a third medium, of each of the boundary acoustic wave devices having the $SiO_2$ films, defining the second media, with thicknesses H2 of about 0.1$\lambda$, about 0.3$\lambda$, and about 0.5$\lambda$ and the acoustic velocity (center frequency×$\lambda$). FIG. 10 is a graph showing the relationship between the thickness H3 of a polycrystalline Si film and the temperature coefficient of frequency.

The thickness of the $SiO_2$ film defining the fourth medium is unrelated to the acoustic velocity because of the boundary acoustic wave device.

FIG. 9 shows that the acoustic velocity is significantly changed within the range of about 0 to about 0.1$\lambda$ in thickness of the polycrystalline Si film, and the frequency adjustment can be efficiently performed within the range. FIG. 10 shows that the temperature coefficient of frequency (TCF) is improved up to about 25 ppm/° C. within the range as compared to the temperature coefficient of frequency in EXAMPLE 1 shown in FIG. 8. At a thickness of the $SiO_2$ film, defining the second medium, of about 0.5$\lambda$, the acoustic velocity was changed as shown in FIG. 9. At a thickness of the second medium greater than about 0.5$\lambda$, the acoustic velocity was not changed by changing the thickness H3 of the polycrystalline Si film.

Thus, in the boundary acoustic wave device including the first to fourth media laminated together, the thickness H2 of the second medium is preferably about 0.5$\lambda$.

Figure 11:
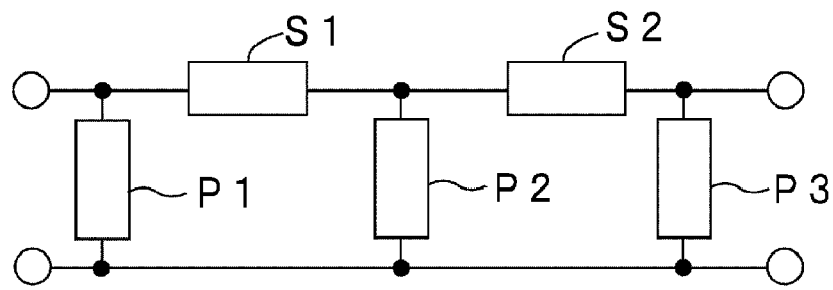
FIG. 11 is a circuit diagram of a ladder filter as an example of a boundary acoustic wave device according to a preferred embodiment of the present invention.
Figure 12:
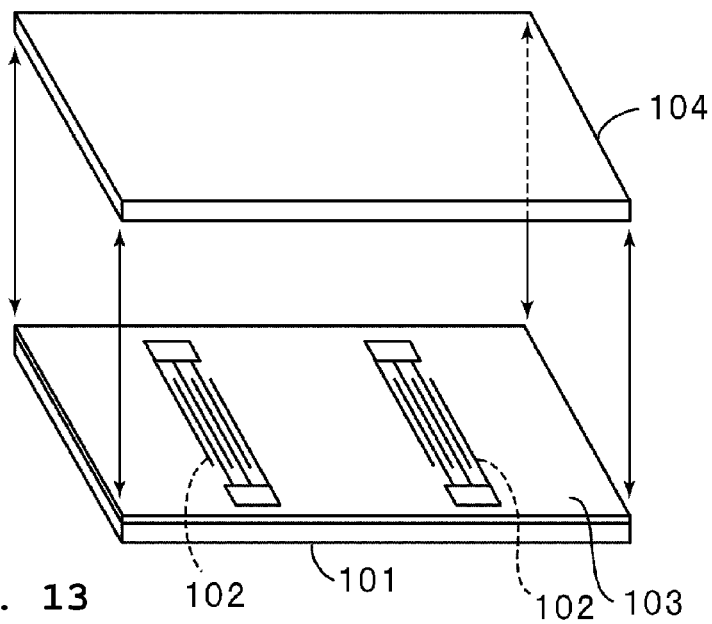
FIG. 12 is a perspective view illustrating an example of a known boundary acoustic wave device.

In the examples described above, the longitudinally coupled boundary acoustic wave resonator filter having a three-IDT structure shown in FIG. 2A has been described. However, the boundary acoustic wave devices according to various preferred embodiments of the present invention may have various electrode structures. That is, a longitudinally coupled boundary acoustic wave resonator filter including two or more IDTs may be used. As shown in FIG. 11, which is a circuit diagram, a ladder filter in which a plurality of boundary acoustic wave resonators S1, S2, P1, and P2 are connected may be used. While four boundary acoustic wave resonators are preferably connected In FIG. 11, a ladder filter including the any suitable number of stages may be used.

The number of resonators in the ladder filter is not particularly limited. In the boundary acoustic wave device and the method for producing the boundary acoustic wave device according to preferred embodiments of the present invention, a laterally coupled boundary acoustic wave filter may be used.

A comb-shape transducer (see "Dansei Hyomenha Kogaku", published by Institute of Electronics, Information and Communication Engineers, sixth impression of the first edition, page 57) in place of the IDT may be used as the electrode. When such a comb-shape transducer is used, $\lambda$ is defined as the period of arrangement of strips of the comb-shape transducer. That is, a wavelength at which an electroacoustic transducer is excited may be defined as $\lambda$.

In EXAMPLES 1 and 2, the electrode is formed of the laminate including the Au electrode layer as a main component and the underlying NiCr layer. However, the electrode may be composed of other metals. For example, the electrode may include one metal selected from Ag, Cu, Fe, Ta, W, Ti, and Pt. In addition, to enhance adhesion between the electrode and the first and second media and to enhance power durability, a second thin electrode layer including Ti, Cr, NiCr, or other suitable material may be laminated. The second electrode layer may be disposed between the first medium and the electrode layer primarily composed of Au. Alternatively, the second electrode layer may be disposed between the main electrode layer and the second medium. Furthermore, the electrode may have a structure in which three or more electrode layers are laminated. In this case, the second electrode layer may be laminated as an interlayer.

In various preferred embodiments of the present invention, the electrode structure may include an alloy of a plurality of metals.

The materials defining the first to third media and the first to fourth media according to the present invention are not particularly limited. That is, various dielectrics may be used as the media. An example thereof is one material selected from the group consisting of lithium niobate, potassium niobate, lithium tantalate, lithium tetraborate, langasite, langanite, quartz, lead zirconate titanate ceramics, ZnO, AlN, silicon oxides, glass, silicon, sapphire, silicon nitrides, and carbon nitrides.

Furthermore, the medium is not necessarily made of a single material, but may have a laminated structure in which a plurality of medium layers are laminated. That is, at least one medium among the first to third media and the first to fourth media may have the laminated structure in which a plurality of medium layers are laminated.

Furthermore, in the boundary acoustic wave device according to various preferred embodiments of the present invention, a protective layer for enhancing strength and preventing the penetration of corrosive gas and other contaminants may be formed on the outer surface. The boundary acoustic wave device may also be housed in a package if increased size of the component does not cause problems.

The protective layer may be made of an insulating material, such as titanium oxide, aluminum nitride, or aluminum oxide, a metal, such as Au, Al, or W, or a resin such as an epoxy resin.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a boundary acoustic wave device that includes a first medium, a second medium, and a third medium laminated in that order, and electrodes disposed at an interface between the first medium and the second medium, the method comprising the steps of:

forming a laminate including the first medium, the second medium, and the electrodes disposed at the interface between the first medium and the second medium;

adjusting a thickness of the second medium after the step of forming the laminate to regulate at least one of a frequency and an acoustic velocity of a surface acoustic wave, a pseudo-boundary acoustic wave, or a boundary acoustic wave; and after the adjusting step, forming the third medium different from the second medium in terms of at least one of the acoustic velocity with which the boundary acoustic wave propagates through the second and third mediums and in terms of material.

2. The method for producing a boundary acoustic wave device according to claim 1, wherein the third medium has a thickness greater than about 0.5 $\lambda$, wherein $\lambda$ represents a wavelength of the boundary acoustic wave.

3. The method for producing a boundary acoustic wave device according to claim 1, wherein at least one of the first, second, and third media has a laminated structure in which a plurality of material layers are laminated.

4. The method for producing a boundary acoustic wave device according to claim 1, wherein each of the electrodes are made of one metal selected from the group consisting of Au, Ag, Cu, Fe, Ta, W, Ti, and Pt.

5. The method for producing a boundary acoustic wave device according to claim 1, wherein each of the first, second, and third media are made of at least one material selected from the group consisting of lithium niobate, potassium niobate, lithium tantalate, lithium tetraborate, langasite, langanite, quartz, lead zirconate titanate ceramics, ZnO, AlN, silicon oxides, glass, silicon, sapphire, silicon nitrides, and carbon nitrides.

6. The method for producing a boundary acoustic wave device according to claim 1, wherein the electrodes define one of a boundary acoustic wave resonator and a boundary acoustic wave filter.

* * * * *